(12) United States Patent
Wu et al.

(10) Patent No.: US 12,512,326 B2
(45) Date of Patent: Dec. 30, 2025

(54) METHOD FOR PROCESSING SEMICONDUCTOR STRUCTURE AND METHOD FOR FORMING WORD LINE STRUCTURE

(71) Applicant: CHANGXIN MEMORY TECHNOLOGIES, INC., Anhui (CN)

(72) Inventors: Runping Wu, Hefei (CN); Jun Zhang, Hefei (CN); Li Ma, Hefei (CN); Taegyun Kim, Hefei (CN); Soonbyung Park, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 673 days.

(21) Appl. No.: 17/949,278

(22) Filed: Sep. 21, 2022

(65) Prior Publication Data

US 2023/0022780 A1 Jan. 26, 2023

Related U.S. Application Data

(63) Continuation of application No. PCT/CN2022/105173, filed on Jul. 12, 2022.

(30) Foreign Application Priority Data

Jun. 23, 2022 (CN) .......................... 202210726017.X

(51) Int. Cl.
*H01L 21/3105* (2006.01)
*H01L 21/02* (2006.01)
*H01L 21/687* (2006.01)

(52) U.S. Cl.
CPC .. *H01L 21/31055* (2013.01); *H01L 21/02074* (2013.01); *H01L 21/68764* (2013.01)

(58) Field of Classification Search
CPC ........ H01L 21/02074; H01L 21/68764; H01L 21/76834; H01L 21/7684; H01L 21/76883; H01L 21/31055
See application file for complete search history.

(56) References Cited

U.S. PATENT DOCUMENTS 6,461,914 B1 * 10/2002 Roberts ............... H01L 23/5223
438/240
2007/0262451 A1 11/2007 Rachmady
(Continued)

FOREIGN PATENT DOCUMENTS

CN 101438389 A 5/2009
CN 103094210 A 5/2013
(Continued)

*Primary Examiner* — Alexander G Ghyka
(74) *Attorney, Agent, or Firm* — Syncoda LLC; Feng Ma

(57) ABSTRACT

A method for processing a semiconductor structure and a method for forming a word line structure are provided. The method for processing the semiconductor structure includes: providing a semiconductor structure including a groove and a metal layer located in the groove, where an edge position of a top surface of the metal layer is higher than a center position of the top surface of the metal layer; enabling the semiconductor structure to be in a rotating state; and performing at least one metal surface planarization process on the semiconductor structure, so that the top surface of the metal layer after being processed is more planar than the top surface of the metal layer before being processed. Each of the at least one metal surface planarization process includes: etching the top surface of the metal layer by a first reagent; and cleaning the semiconductor structure by a second reagent.

14 Claims, 9 Drawing Sheets

(56) References Cited

U.S. PATENT DOCUMENTS

| | | | |
|---|---|---|---|
| 2011/0210403 A1* | 9/2011 | Teo | H10D 84/038 |
| | | | 257/E21.575 |
| 2012/0264285 A1 | 10/2012 | Rachmady | |
| 2017/0186844 A1 | 6/2017 | Kim et al. | |
| 2019/0295839 A1* | 9/2019 | Endo | H01L 21/67167 |
| 2020/0152754 A1 | 5/2020 | Kim et al. | |
| 2021/0082767 A1* | 3/2021 | Kim | H10B 12/053 |
| 2021/0183865 A1 | 6/2021 | Neelapala et al. | |
| 2022/0085187 A1 | 3/2022 | Fan et al. | |
| 2022/0122888 A1 | 4/2022 | Kim et al. | |

FOREIGN PATENT DOCUMENTS

| | | |
|---|---|---|
| CN | 106941120 A | 7/2017 |
| CN | 112447726 A | 3/2021 |
| CN | 112599411 A | 4/2021 |
| CN | 112635421 A | 4/2021 |

* cited by examiner

METHOD FOR PROCESSING SEMICONDUCTOR STRUCTURE AND METHOD FOR FORMING WORD LINE STRUCTURE

CROSS-REFERENCE TO RELATED APPLICATIONS

This is a continuation of International Patent Application No. PCT/CN2022/105173, filed on Jul. 12, 2022, which claims priority to Chinese Patent Application No. 202210726017.X, filed on Jun. 23, 2022. The disclosures of International Patent Application No. PCT/CN2022/105173 and Chinese Patent Application No. 202210726017.X are hereby incorporated by reference in their entireties.

BACKGROUND

A Buried Word Line (BWL, which may also be referred to as a buried gate) provides a new option for increasing the integrated density of a semiconductor device. The BWL means that the word line is buried inside a semiconductor substrate, which can significantly reduce the parasitic capacitance between a word line and a bit line, and greatly improve the reliability of a voltage readout operation of the semiconductor device.

SUMMARY

The disclosure relates to the field of semiconductor manufacturing, and in particular, to a method for processing a semiconductor structure and a method for forming a word line structure.

According to a first aspect of the embodiments of the disclosure, there is provided a method for processing a semiconductor structure, which includes the following operations.

A semiconductor structure including a groove and a metal layer located in the groove is provided. An edge position of a top surface of the metal layer is higher than a center position of the top surface of the metal layer.

The semiconductor structure is enabled to be in a rotating state.

At least one metal surface planarization process is performed on the semiconductor structure, so that the top surface of the metal layer after being processed is more planar than the top surface of the metal layer before being processed.

Each of the at least one metal surface planarization process includes the following operations.

The top surface of the metal layer is etched by a first reagent.

The semiconductor structure is cleaned by a second reagent.

According to a second aspect of the embodiments of the disclosure, there is provided a method for forming a word line structure, which includes the following operations.

A substrate may be provided.

A groove is formed in the substrate, and a dielectric material layer is formed on a bottom surface and a side wall of the groove and on a surface of the substrate.

A pre-metal layer is formed on the dielectric material layer.

The pre-metal layer is etched to form a metal layer located in the groove. An edge position of a top surface of the metal layer is higher than a center position of the top surface of the metal layer.

The metal layer is processed by the method for processing the semiconductor structure of any one of the abovementioned embodiments.

BRIEF DESCRIPTION OF THE DRAWINGS

In order to illustrate the technical solutions in the embodiments of the disclosure or the prior art more clearly, the drawings required to be used in the embodiments will be briefly described below. Apparently, the drawings in the following description are merely some embodiments of the present disclosure, and those of ordinary skill in the art may still derive other drawings from these drawings without creative efforts.

Figure 1:
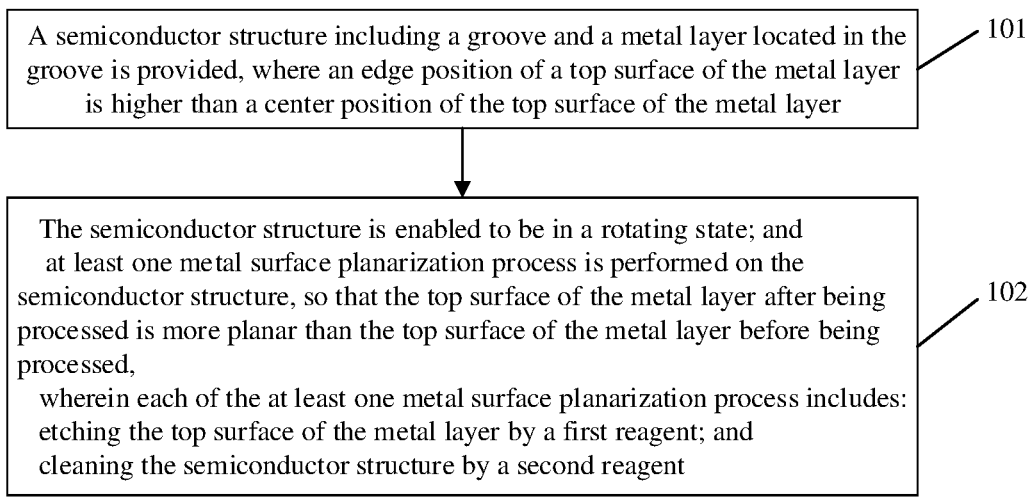
FIG. 1 illustrates a schematic flowchart of a method for processing a semiconductor structure provided by the embodiments of the disclosure.

Reference signs in the drawings is listed as follows:
1—semiconductor structure; 10—substrate; 100—groove; 110—metal layer; 110'—pre-metal layer; 111—top surface; 112—void; 120—dielectric material layer; 130—polysilicon layer; and 140—isolating layer.

DETAILED DESCRIPTION

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, not all the features of the actual embodiments are described here, and the known functions and structures are not described in detail.

In the drawings, the dimensions of layers, areas, and elements and their relative dimensions may be exaggerated for clarity. Throughout, the same reference signs represent the same elements.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms "first", "second", "third", etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer or part without departing from the teaching of the disclosure. However, when second element, component, area, layer, or part is discussed, it does not mean that the first element, component, area, layer, or part must exist in the disclosure.

Spatial relational terms such as "under", "below", "lower", "beneath", "above", "upper", etc. may be used herein for ease of description to describe the relationship between one element or feature and other elements or features illustrated in the drawings. It should be understood that in addition to the orientations shown in the drawings, the spatial relationship term intention also includes different orientations of devices in use and operation. For example, if the devices in the drawings are turned upside down, then the elements or features described as "under" or "below" or "beneath" other elements will be oriented to be "above" other elements or features. Therefore, exemplary terms "under" and "below" may include both upper and lower orientations. The devices may be otherwise oriented (rotated 90° or other orientations) and the spatial descriptors used herein are interpreted accordingly.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

In order to thoroughly understand the disclosure, detailed steps and detailed structures will be proposed in the following description in order to explain the technical solution of the disclosure. Preferred embodiments of the disclosure are described in detail below. However, in addition to these detailed descriptions, the disclosure may have other implementation modes.

In a manufacturing process of a buried word line, a conductive material (such as titanium nitride (TiN)) deposited in the groove of the word line needs to be etched back to a certain degree. The inventors of the disclosure have found that: during etching back the TiN metal layer in the groove of the word line, the etching rate of the center the metal layer is not completely same as the etching rate of the edge of the metal layer, which will lead to the unevenness of the surface of the metal layer after etching, and forming a "bunny ear" shape (i.e., the shape with a low center and a high edge, as shown in FIG. 2D), thereby causing high threshold voltage (Vt) and Gate-Induced Drain Leakage (GIDL).

On this basis, the embodiments of the disclosure provide a method for processing a semiconductor structure. Specifically referring to FIG. 1, as shown in the drawing, the method includes the following steps.

At S101: a semiconductor structure including a groove and a metal layer located in the groove is provided. An edge position of a top surface of the metal layer is higher than a center position of the top surface of the metal layer.

At S102, the semiconductor structure is enabled to be in a rotating state; and at least one metal surface planarization process is performed on the semiconductor structure, so that the top surface of the metal layer after being processed is more planar than the top surface of the metal layer before being processed. Each of the at least one metal surface planarization process includes: etching the top surface of the metal layer by a first reagent; and cleaning the semiconductor structure by a second reagent.

The method for processing the semiconductor structure provided by the embodiments of the disclosure will further be described in detail below with reference to specific embodiments.

FIG. 2A to FIG. 2G illustrate schematic structural diagrams of the semiconductor structure provided by the embodiments of the disclosure during processing.

First, referring to FIG. 2A to FIG. 2D, S101 is executed to provide a semiconductor structure 1. The semiconductor structure 1 includes a groove 100 and a metal layer 110 located in the groove. An edge position of a top surface 111 of the metal layer 110 is higher than a center position of the top surface 111 of the metal layer 110.

Figure 2A:
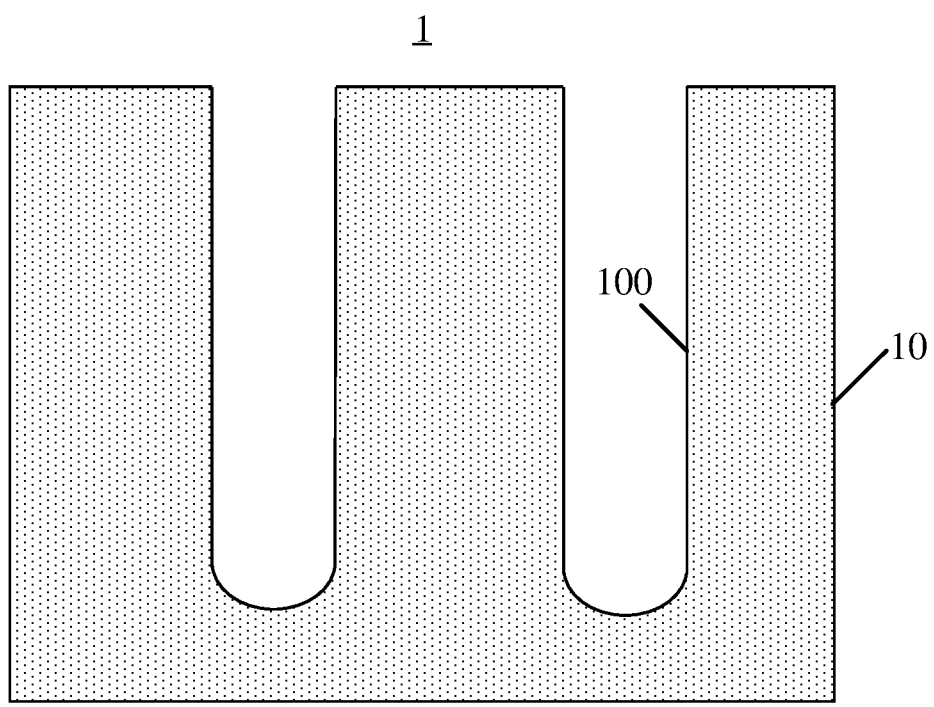
FIG. 2A to FIG. 2G illustrate schematic structural diagrams of the semiconductor structure provided by the embodiments of the disclosure during processing.

Referring to FIG. 2A, a semiconductor structure 1 is provided. The semiconductor structure 1 includes a substrate 10. For example, a groove 100 may be formed in the substrate 10.

In an embodiment, the substrate 10 may be a wafer in a semiconductor manufacturing process stage.

In an embodiment, the substrate 10 may be a silicon substrate, a germanium substrate, a silicon germanium substrate, a silicon carbide substrate, a Silicon On Insulator (SOI) substrate or a Germanium On Insulator (GOI) substrate, etc., may also be a substrate including other elemental semiconductors or compound semiconductors, such as a glass substrate or a III-V group compound substrate (for example, a gallium nitride substrate or a gallium arsenide substrate), may also be a stacked structure, such as Si/SiGe, and may also be other epitaxial structures, such as Silicon Germanium On Insulator (SGOI). In the embodiments of the disclosure, the substrate may be a silicon substrate.

For example, a mask layer (not shown in the drawings) may be grown on an upper surface of the substrate first, then the mask layer is patterned to display a groove pattern to be etched on the mask layer, and the mask layer may be patterned by a lithography process. The mask layer may be a photoresist mask or a hard mask patterned on the basis of a lithographic mask. When the mask layer is the photoresist mask, the mask layer is patterned through the steps of exposing, developing, degumming, etc. specifically. Then, a groove with certain depth is etched according to the groove pattern to be etched.

Here, for example, the groove 100 may be formed by a dry etching process.

Figure 2B:
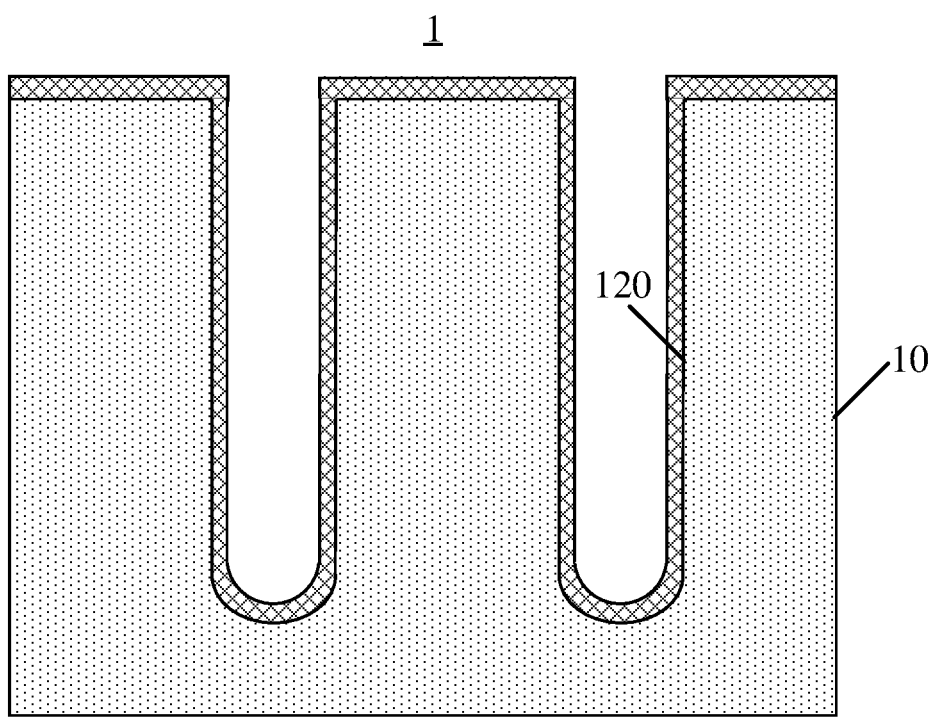

Then, referring to FIG. 2B, after the groove 100 is formed, a dielectric material layer 120 is formed on a bottom surface and a side wall of the groove 100 and on a surface of the substrate 10.

In actual operations, the dielectric material layer 120 may be formed by one or more thin film deposition processes. For example, the deposition processes include, but are not limited to, a Chemical Vapor Deposition (CVD) process, a Plasma Enhanced Chemical Vapor Deposition (PECVD) process, an Atomic Layer Deposition (ALD) process, or combinations thereof.

The material of the dielectric material layer 120 includes, but is not limited to, oxides, nitrides, metal oxides, oxynitrides, etc. Optionally, the material of the dielectric material layer 120 includes a high-K dielectric material. The high-K dielectric material may include hafnium element. Specifically, the high-K dielectric material may include, but is not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), hafnium silicon nitrogen oxide (HfSiON), hafnium zirconate ($HfZrO_4$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$), etc.

It can be understood that the dielectric material layer is located between the substrate and a subsequently formed metal layer.

Figure 2C:
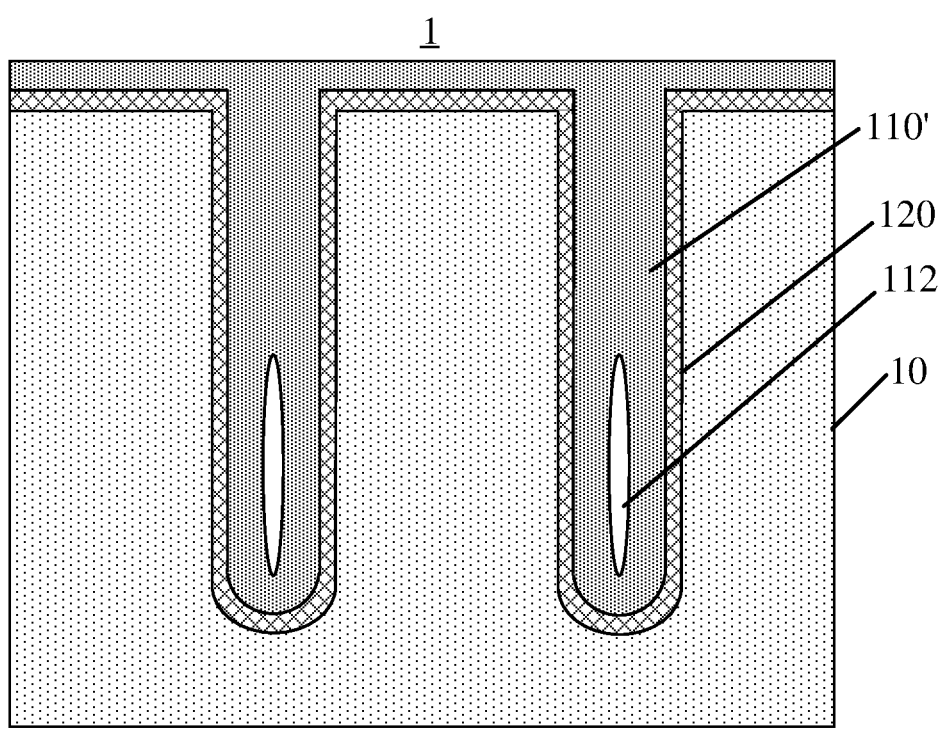
Figure 2D:
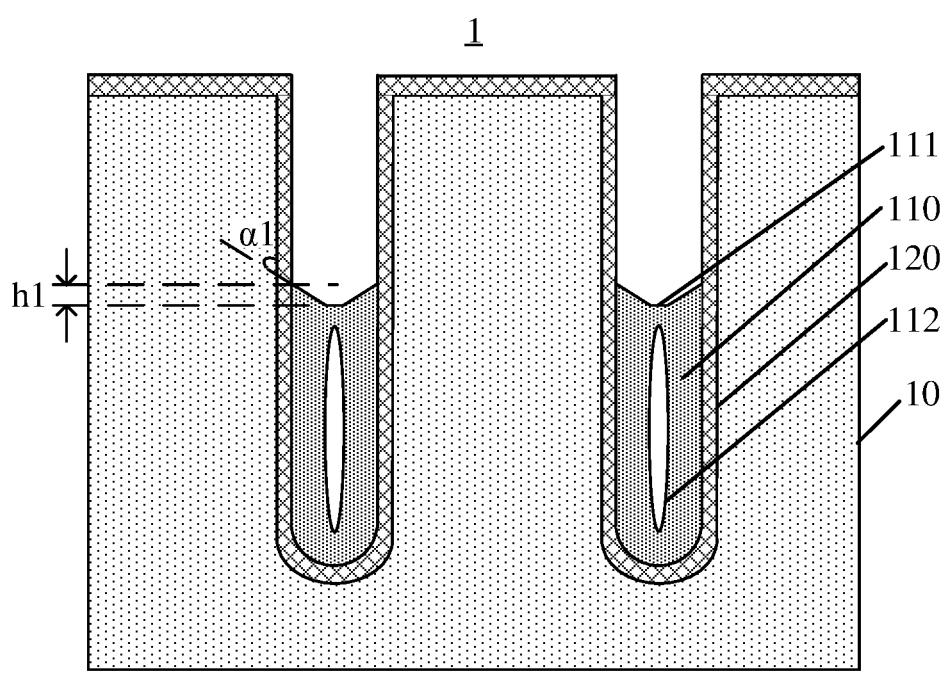

Then, referring to FIG. 2C, after the dielectric material layer 120 is formed, a metal material is deposited in the groove 100 to form a pre-metal layer 110'.

For example, the pre-metal layer 110' is not only formed on the side wall and the bottom surface of the dielectric material layer 120, but also formed on the dielectric material layer 120 located on the surface of the substrate 10. Moreover, the pre-metal layer 110' may fully fill the groove 100.

In actual operations, the pre-metal layer 110' may be formed by one or more thin film deposition processes. For example, the deposition processes include, but are not limited to, a CVD process, a PECVD process, an ALD process, or combinations thereof.

Then, referring to FIG. 2D, the pre-metal layer 110' is etched to form the metal layer 110.

In actual operations, the whole pre-metal layer 110' located on the surface of the substrate 10 and part of the pre-metal layer 110' located in the groove 100 may be removed by etching, so as to form the metal layer 110.

The etching process is a plasma etching process. For example, the plasma etching process includes at least one of a Reaction Ion Etching (RIE) process or a High Density Plasma (HDP) etching process.

In the drawing as shown in FIG. 2C, during forming the pre-metal layer 110', a void 112 may be formed in the pre-metal layer 110' due to a process. The existence of the void 112 may also cause metal residue at the edge position of the top surface of the metal layer during forming the metal layer by etching.

During etching, there may be metal residue at the edge position of the top surface of the metal layer, so that the edge position of the top surface 111 of the metal layer 110 is higher than the center position of the top surface 111 of the metal layer 110, so as to form a "bunny ear" shape as shown in FIG. 2D. The surface of the "bunny ear"-shaped metal layer will affect the performance of a device, so the "bunny ear"-shaped surface of the metal layer needs to be processed to make it planar.

Figure 2E:
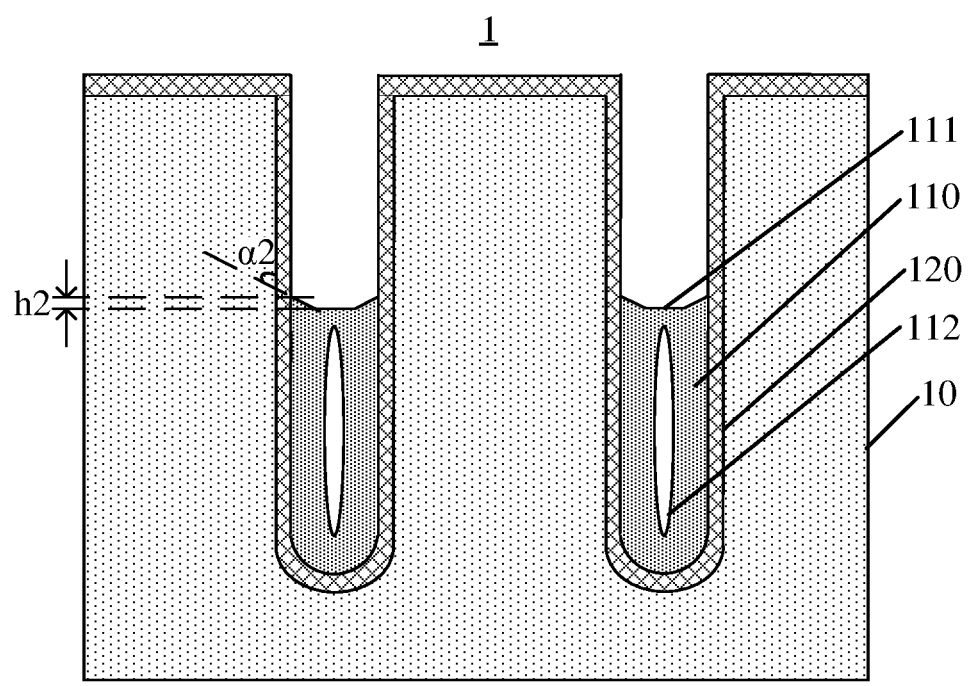
Figure 2F:
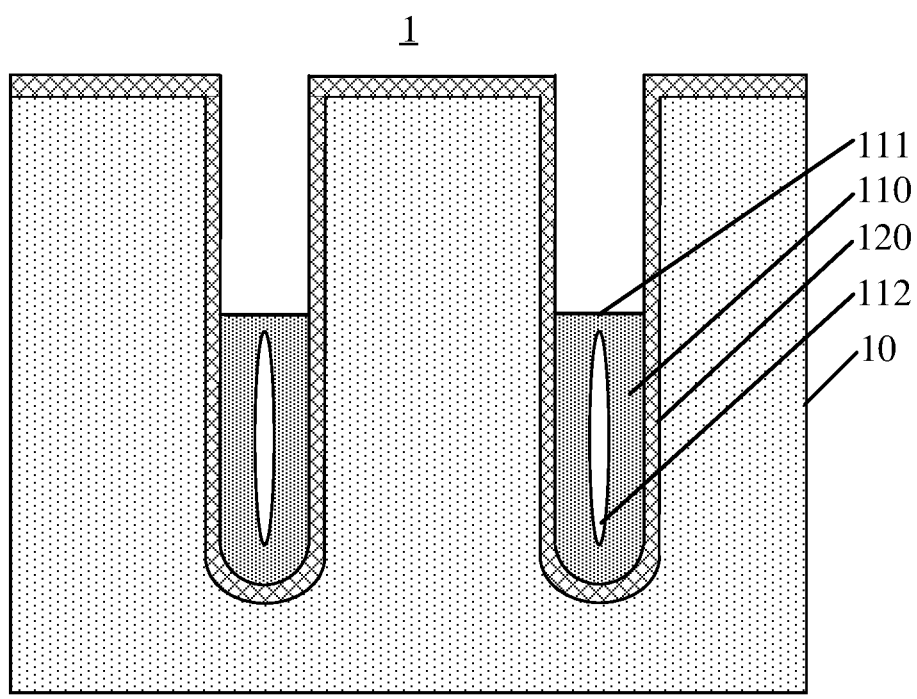

Then, referring to FIG. 2E and FIG. 2F, S102 is executed, so that the semiconductor structure 1 is in a rotating state. At least one metal surface planarization process is performed on the semiconductor structure 1, so that the top surface 111 of the metal layer 110 after being processed is more planar than the top surface 111 of the metal layer 110 before being processed. Each of the at least one metal surface planarization process includes etching the top surface 111 of the metal layer 110 by a first reagent; and cleaning the semiconductor structure 1 by a second reagent.

Referring to FIG. 2D and FIG. 2E first, in a process from FIG. 2D to FIG. 2E, at least one metal surface planarization process is performed on the semiconductor structure 1, so that the top surface 111 of the metal layer 110 of the semiconductor structure 1 as shown in FIG. 2E is more planar than the top surface 111 of the metal layer 110 of the semiconductor structure 1 as shown in FIG. 2D.

For example, reference is made to FIG. 2D and FIG. 2E. An included angle between the "bunny ear" shape at the edge position of the top surface 111 of the metal layer 110 of the semiconductor structure 1 as shown in FIG. 2D and the side wall of the groove 100 is $\alpha 1$, and the height by which the edge position of the top surface 111 is higher than the middle position is h1. An included angle between the "bunny ear" shape at the edge position of the top surface 111 of the metal layer 110 of the semiconductor structure 1 as shown in FIG. 2E and the side wall of the groove 100 is $\alpha 2$, and the height by which the edge position of the top surface 111 is higher than the middle position is h2, where $\alpha 1$ is less than $\alpha 2$, h1 is greater than h2.

It can be understood that when the included angle between the "bunny ear" shape at the edge position of the top surface 111 of the metal layer 110 of the semiconductor structure 1 and the side wall of the groove 100 is greater, the height by which the edge position of the top surface 111 of the metal layer 110 is higher than the middle position is smaller, that is, the slope of the "bunny ear" shape at the edge position is more gentle. Thus, it is indicated that the top surface 111 of the metal layer 110 after being processed can be more planar than the top surface 111 of the metal layer 110 before being processed by performing at least one metal surface planarization process on the semiconductor structure 1.

Then, referring to FIG. 2F, after the top surface 111 of the metal layer 110 of the semiconductor structure 1 is subjected to at least one metal surface planarization process, the top surface 111 basically reach a planar state finally.

In an embodiment, the material of the metal layer 110 includes at least one of TiN, molybdenum, or tungsten. It can be understood that the material of the metal layer provided in the embodiments of the disclosure is only a subordinate and feasible specific implementation mode in the embodiments of the disclosure, and does not constitute a limitation to the disclosure. The material of the metal layer may also be other materials.

In an embodiment, after performing the at least one metal surface planarization process, the top surface 111 of the metal layer 110 is located above the void 112, so as to ensure that the top surface 111 of the metal layer 110 basically reach a planar state finally.

In an embodiment, a rotating speed of the semiconductor structure ranges from 500 rpm to 800 rpm. The rotating speed of the semiconductor structure is within this range, which can ensure that the best effect is achieved when a residual metal at the edge position of the top surface of the metal layer is etched by a cleaning agent. Otherwise, if the rotating speed is too fast, the cleaning agent is thrown out without acting with the residual metal of the top surface of the metal layer. If the rotating speed is too slow, the cleaning agent is not in full contact with the residual metal, and a very good effect of removing the residual metal cannot be achieved.

In an embodiment, in a process of etching the top surface of the metal layer by a first reagent, the semiconductor structure rotates at a first rotating speed. In a process of cleaning the semiconductor structure by a second reagent, the semiconductor structure rotates at a second rotating speed. The first rotating speed is less than the second rotating speed.

When the top surface of the metal layer is etched by the first reagent, the rotating speed of the semiconductor structure is lower, so that the first reagent can be more fully in contact with the residual metal, and an effect of oxidizing and corroding can be achieved better. When the semiconductor structure is cleaned by the second reagent, the rotating speed of the semiconductor structure is higher, and thus a centrifugal force is greater, and the semiconductor structure can be cleaned better by the second reagent. Therefore, the first reagent and an oxidation reactant of the residual metal are cleaned.

In an embodiment, in a process of etching the top surface of the metal layer by a first reagent, the semiconductor structure rotates at a first rotating speed. In a process of cleaning the semiconductor structure by a second reagent, the semiconductor structure rotates at a second rotating speed. The first rotating speed is equal to the second rotating speed.

The rotating speed when the top surface of the metal layer is etched by the first reagent is the same as the rotating speed when the semiconductor structure is cleaned by the second reagent, so that the rotating speed does not need to be adjusted in the whole cleaning process and only one rotating speed needs to be maintained. Therefore, the cost can be saved better, and the process is simpler.

In an embodiment, the first reagent includes an acid reagent, and the second reagent includes at least one of an alkaline reagent or a neutral reagent. The acid reagent may etch the top surface of the metal layer of the semiconductor structure due to its oxidizing and corroding effects. The alkaline reagent or the neutral reagent may rinse the semiconductor structure after the etching of the acid reagent, so as to remove residual acid reagent and residues after etching. The alkaline reagent can also neutralize the residual acid reagent.

For example, in an embodiment, the first reagent includes at least one of SC2 solution (a mixed solution of deionized water, HCl and $H_2O_2$), a mixed solution of sulfuric acid and hydrogen peroxide solution (SPM), or a mixed solution of hydrochloric acid and the hydrogen peroxide solution (HPM). The second reagent includes at least one of SC1 solution (a mixed solution of deionized water, $NH_4OH$, and $H_2O_2$), deionized aqueous solution, aqueous ammonia, or hydrogen peroxide. The SC2 solution, the mixed solution of sulfuric acid and hydrogen peroxide, and the mixed solution of hydrochloric acid and hydrogen peroxide can corrode, by oxidation, the residual metal at the edge position of the top surface of the metal layer, and the SC1 solution, the deionized aqueous solution, the aqueous ammonia, and the hydrogen peroxide can rinse the mixed solution of sulfuric acid and hydrogen peroxide and the residues after the oxidization of the metal, so that the surface of the metal layer is planar. It can be understood that the materials of the first reagent and the second reagent provided in the embodiments of the disclosure are only a feasible specific implementation mode in the embodiments of the disclosure, and do not constitute a limitation to the disclosure. The first reagent and the second reagent may be selected according to the material of the metal layer.

In an embodiment, a volume ratio of sulfuric acid to hydrogen peroxide solution in the mixed solution of sulfuric acid and hydrogen peroxide solution ranges from 5:1 to 8:1. When the volume ratio of sulfuric acid to hydrogen peroxide in the mixed solution of sulfuric acid and hydrogen peroxide solution is within this range, the mixed solution of sulfuric acid and hydrogen peroxide solution can achieve the effects of oxidizing and corroding the residual metal better.

In a specific embodiment, in the mixed solution of sulfuric acid and hydrogen peroxide solution, the mass fraction of the sulfuric acid is 96%, and the mass fraction of hydrogen peroxide solution is 30%.

In an embodiment, in a process of removing the residual metal at the edge position of the top surface of the metal layer by one or more of the SC2 solution, the mixed solution of sulfuric acid and hydrogen peroxide solution, and the mixed solution of hydrochloric acid and hydrogen peroxide solution, the SC2 solution, the mixed solution of sulfuric acid and hydrogen peroxide solution, and the mixed solution of hydrochloric acid and hydrogen peroxide solution may be maintained at a preset temperature, which can ensure a high etching speed during etching.

In the present embodiment, in a process of performing at least one metal surface planarization process, when the residual metal at the edge position of the top surface of the metal layer is removed by one or more of the SC2 solution, the mixed solution of sulfuric acid and hydrogen peroxide solution, and the mixed solution of hydrochloric acid and hydrogen peroxide solution, the contact between an etching liquid and the surface of the metal layer is more uniform than the contact between an etching gas and the surface of the metal layer compared with a mode of etching the residual metal on the surface of the metal layer by a gas. Thus, the metal layer may be etched by one or more of the SC2 solution, the mixed solution of sulfuric acid and hydrogen peroxide solution, and the mixed solution of hydrochloric acid and hydrogen peroxide solution, the surface after the residual metal is removed has higher planeness.

In an embodiment, the at least one metal surface planarization process includes 4 to 8 metal surface planarization processes. When the number of cycles is within this range, the effect of removing the residual metal at the edge of the top surface of the metal layer is the best. Otherwise, if the number of cycles is too small, the residual metal is not completely removed, and if the number of cycles is too large, the part of the metal layer other than the residual metal will be removed excessively, which affects the performance of a device.

For example, in a specific example, the metal layer is subjected to a planarization process by taking the mixed solution of sulfuric acid and hydrogen peroxide solution as a first reagent and taking deionized water as a second reagent. The comparison between the number and time of the metal surface planarization process and the processing effect is shown in the following table. As shown in the following table, E/A in the table represents the thickness of the etched metal layer in a metal surface planarization process. The greater the value of the E/A is, the greater the thickness of the etched metal layer is. The smaller the value of the E/A is, the smaller the thickness of the etched metal layer is. In the table, each of 600:80, 600:90 and 600:100 refers to the volume ratio of the sulfuric acid and the hydrogen peroxide solution in the mixed solution of sulfuric acid and hydrogen peroxide solution.

| | Number of cycles | | | | | |
|---|---|---|---|---|---|---|
| | 1 time (600:90) | 4 times (600:90) | 6 times (600:90) | 8 times (600:90) | 4 times (600:80) | 4 times (600:100) |
| The time for etching top surface of metal layer each time | 47 s | 15 s | 11.3 s | 9.1 s | 20.5 s | 11.5 s |
| E/A (nm) | 6.43 | 6.57 | 6.73 | 7.1 | 6.98 | 7.26 |

It can be seen from the table that, when the metal surface planarization process is performed on the top surface of the metal layer for 1 time, the volume ratio of the sulfuric acid and the hydrogen peroxide solution is 600:90, and when the etching time is 47 s, the value of the E/A is 6.43, that is, the thickness of the etched metal layer is 6.43 nm. When the metal surface planarization process is performed on the top surface of the metal layer for 4 times, the volume ratio of the sulfuric acid and the hydrogen peroxide solution is 600:90, and when the etching time for each time is 15 s, the value of the E/A is 6.57, that is, the thickness of the etched metal layer is 6.57 nm. When the metal surface planarization process is performed on the top surface of the metal layer for 6 times, the volume ratio of the sulfuric acid and the hydrogen peroxide solution is 600:90, and when the etching time for each time is 11.3 s, the value of the E/A is 6.73, that is, the thickness of the etched metal layer is 6.73 nm. When the metal surface planarization process is performed on the top surface of the metal layer for 8 times, the volume ratio of the sulfuric acid and the hydrogen peroxide solution is 600:90, and when the etching time for each time is 9.1 s, the value of the E/A is 7.1, that is, the thickness of the etched metal layer is 7.1 nm. When the metal surface planarization process is performed on the top surface of the metal layer for 4 times, the volume ratio of the sulfuric acid and the hydrogen peroxide solution is 600:80, and when the etching time for each time is 20.5 s, the value of the E/A is 6.98, that is, the thickness of the etched metal layer is 6.98 nm. When the metal surface planarization process is performed on the top surface of the metal layer for 4 times, the volume ratio of the sulfuric acid and the hydrogen peroxide solution is 600:100, and when the etching time for each time is 11.5 s, the value of the E/A is 7.26, that is, the thickness of the etched metal layer is 7.26 nm.

In an embodiment, the time for etching the top surface of the metal layer by the first reagent for one time ranges from 8 s to 50 s. In an embodiment, the at least one metal surface planarization process includes a plurality of metal surface planarization processes. A sum of the time for etching the top surface of the metal layer in the plurality of metal surface planarization processes ranges from 45 s to 90 s. The sum of the time for etching the top surface of the metal layer in the plurality of metal surface planarization processes is also within this range to ensure that the etching effect on the top surface of the metal layer reaches the best. On one hand, the thickness of the etched metal layer is reduced, and on the other hand, the planeness of the surface of the etched metal layer is improved.

In an embodiment, the time for cleaning the semiconductor structure by the second reagent for one time ranges from 25 s to 35 s. When the time for cleaning the semiconductor structure each time is within this range, the best cleaning effect can be achieved. Otherwise, if the time is too short, the semiconductor structure is not fully cleaned, and there may be left residue that has not been rinsed. If the time is too long, the cleaning agent will be wasted to increase the cost.

Figure 2G:
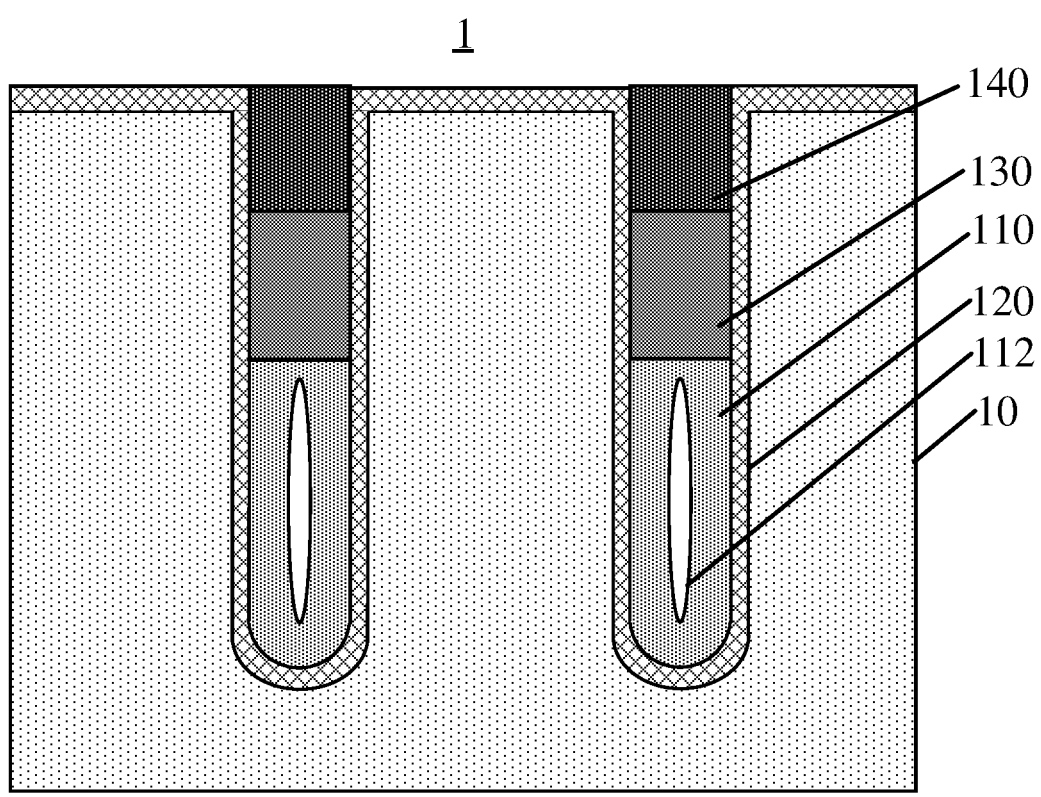

Then, referring to FIG. 2G, after at least one metal surface planarization process is performed on the top surface 111 of the metal layer 110, a polysilicon layer 130 is formed on the top surface 111 of the metal layer 110.

In actual operations, the polysilicon layer 130 may be formed by one or more thin film deposition processes. For example, the deposition processes include, but are not limited to, a CVD process, a PECVD process, an ALD process, or combinations thereof.

Continuing to refer to FIG. 2G, an isolating layer 140 is formed on the polysilicon layer 130 after the polysilicon layer 130 is formed. The material of the isolating layer 140 may be silicon nitride.

In actual operations, the isolating layer 140 may be formed by one or more thin film deposition processes. For example, the deposition processes include, but are not limited to, a CVD process, a PECVD process, an ALD process, or combinations thereof.

In the embodiments of the disclosure, during cleaning, the semiconductor structure is rotated, and at least one metal surface planarization process is performed on the semiconductor structure, so that the edge position of the top surface of the metal layer is impacted by the first reagent under the action of a centrifugal force. As such, the residual metal at the edge position of the top surface of the metal layer of the semiconductor structure is removed, and thus the top surface of the metal layer after being processed is more planar than the top surface of the metal layer before being processed.

Figure 3:
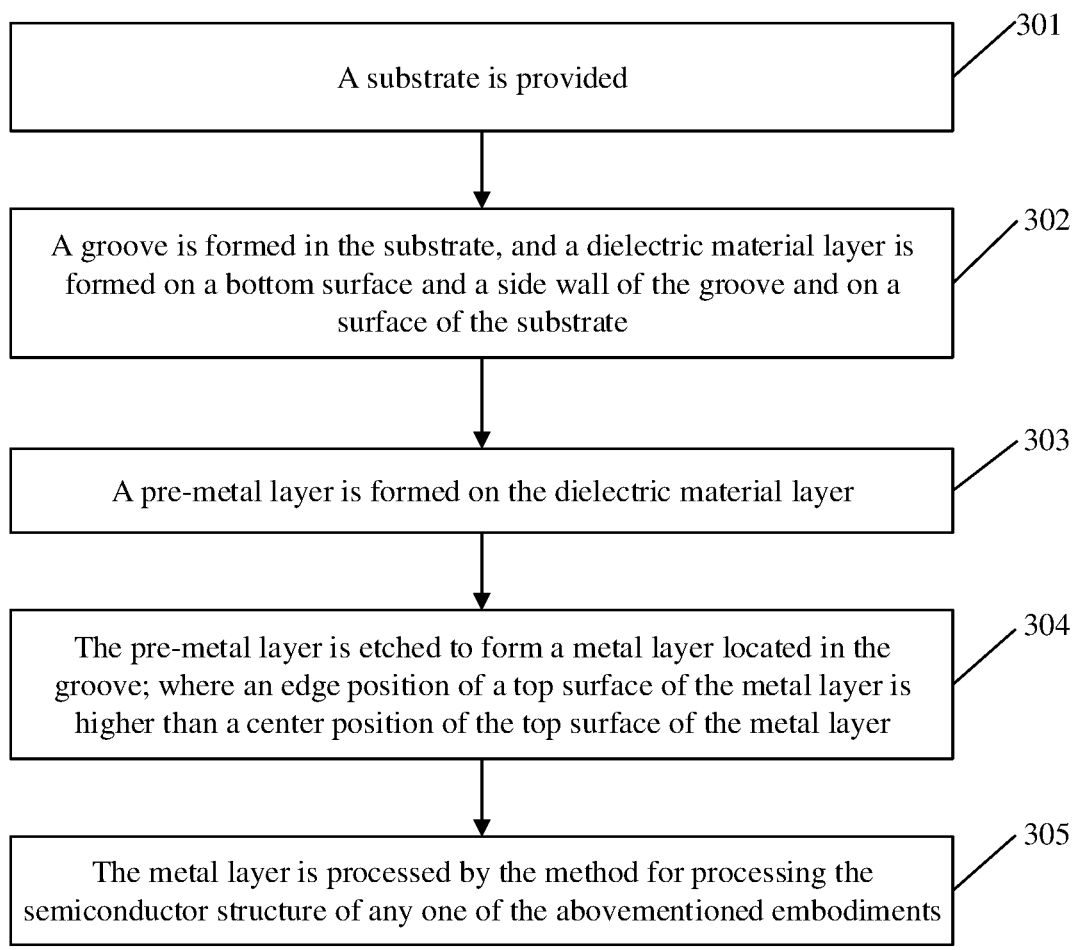
FIG. 3 illustrates a schematic flowchart of a method for forming a word line structure provided by the embodiments of the disclosure.

The embodiments of the disclosure provide a method for forming a word line structure. Specifically referring to FIG. 3, as shown in the drawing, the method includes the following steps.

At S301, a substrate is provided.

At S302, a groove is formed in the substrate, and a dielectric material layer is formed on a bottom surface and a side wall of the groove and on a surface of the substrate.

At S303, a pre-metal layer is formed on the dielectric material layer.

At S304, the pre-metal layer is etched to form a metal layer located in the groove; where an edge position of a top surface of the metal layer is higher than a center position of the top surface of the metal layer.

At S305, the metal layer is processed by the method for processing the semiconductor structure of any one of the abovementioned embodiments.

The method for forming the word line structure provided by the embodiments of the disclosure will further be described in detail below with reference to specific embodiments.

For example, the schematic structural diagram of the word line structure in a forming process may refer to FIG. 2A to FIG. 2G.

First, reference is made to FIG. 2A, S301 is executed to provide a substrate 10.

In an embodiment, the substrate 10 may be a silicon substrate, a germanium substrate, a silicon germanium substrate, a silicon carbide substrate, an SOI substrate or a GOI substrate, etc., may also be a substrate including other elemental semiconductors or compound semiconductors, such as a glass substrate or a III-V group compound substrate (for example, a gallium nitride substrate or a gallium arsenide substrate), may also be a stacked structure, such as Si/SiGe, and may also be other epitaxial structures, such as SGOI. In the embodiments of the disclosure, the substrate may be a silicon substrate.

Then, referring to FIG. 2A and FIG. 2B, S302 is executed to form a groove 100 in the substrate 10 and form a dielectric material layer 120 on a bottom surface and a side wall of the groove 100 and on a surface of the substrate 10.

For example, a mask layer (not shown in the drawings) may be grown on an upper surface of the substrate first, then the mask layer is patterned to display a groove pattern to be etched on the mask layer, and the mask layer may be patterned by a lithography process. The mask layer may be a photoresist mask or a hard mask patterned on the basis of a lithographic mask. When the mask layer is the photoresist mask, the mask layer is patterned through the steps of exposing, developing, degumming, etc. Then, a groove with certain depth is etched according to the groove pattern to be etched.

Here, for example, the groove 100 may be formed by a dry etching process.

In actual operations, the dielectric material layer 120 may be formed by one or more thin film deposition processes. For example, the deposition processes include, but are not limited to, a CVD process, a PECVD process, an ALD process, or combinations thereof.

The material of the dielectric material layer 120 includes, but is not limited to, oxides, nitrides, metal oxides, oxynitrides, etc. Optionally, the material of the dielectric material layer 120 includes a high-K dielectric material. The high-K dielectric material may include hafnium element. Specifically, the high-K dielectric material may include, but is not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), hafnium silicon nitrogen oxide (HfSiON), hafnium zirconate ($HfZrO_4$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$), etc.

It can be understood that the dielectric material layer is located between the substrate and the subsequently formed metal layer.

Then, referring to FIG. 2C, a pre-metal layer 110' is formed on the dielectric material layer 120.

For example, the pre-metal layer 110' is not only formed on the side wall and the bottom surface of the dielectric material layer 120, but also is formed on the dielectric material layer 120 located on the surface of the substrate 10. Moreover, the pre-metal layer 110' may fully fill the groove 100.

In actual operations, the pre-metal layer 110' may be formed by one or more thin film deposition processes. For example, the deposition processes include, but are not limited to, a CVD process, a PECVD process, an ALD process, or combinations thereof.

Then, referring to FIG. 2D, S304 is executed to etch the pre-metal layer 110' to form a metal layer 110 located in the groove. An edge position of a top surface 111 of the metal layer 110 is higher than a center position of the top surface 111 of the metal layer 110.

In actual operations, the whole pre-metal layer 110' located on the surface of the substrate 10 and part of the pre-metal layer 110' located in the groove 100 may be removed by etching, so as to form the metal layer 110.

The etching process is a plasma etching process. For example, the plasma etching process includes at least one of a Reaction Ion Etching (RIE) process or a High Density Plasma (HDP) etching process.

In the drawing as shown in FIG. 2C, during forming the pre-metal layer 110', a void 112 may be formed in the pre-metal layer 110' due to a process. The existence of the void 112 may also cause metal residue at the edge position of the top surface of the metal layer during forming the metal layer by etching.

During etching, there may be metal residue at the edge position of the top surface of the metal layer, so that the edge position of the top surface 111 of the metal layer 110 is higher than the center position of the top surface 111 of the metal layer 110, so as to form a "bunny ear" shape as shown in FIG. 2D. The "bunny ear"-shaped metal layer surface will affect the performance of the device, so the "bunny ear"-shaped surface of the metal layer needs to be processed to make it planar.

Then, referring to FIG. 2D to FIG. 2F, S305 is executed to process the metal layer by the method for processing the semiconductor structure of any one of the abovementioned embodiments.

More details of the method for processing the metal layer may refer to the abovementioned embodiments in the method for processing the semiconductor structure, which will not be elaborated herein.

Then, referring to FIG. 2G, the method further includes forming a polysilicon layer 130 on the metal layer 110, where the polysilicon layer 130 is located in the groove 100; and an isolating layer 140 is formed on the polysilicon layer 130.

For example, after the top surface 111 of the metal layer 110 becomes more planar after being subjected to at least one metal surface planarization process, the polysilicon layer 130 is formed on the top surface 111 of the metal layer 110.

In actual operations, a polysilicon material layer may be formed by one or more thin film deposition processes, and the polysilicon material layer is etched back to form the polysilicon layer 130. For example, the deposition processes include, but are not limited to, a CVD process, a PECVD process, an ALD process, or combinations thereof.

Continuing to refer to FIG. 2G, an isolating layer 140 is formed on the polysilicon layer 130 after the polysilicon layer 130 is formed. The material of the isolating layer 140 may be silicon nitride.

In actual operations, the isolating layer 140 may be formed by one or more thin film deposition processes. For example, the deposition processes include, but are not limited to, a CVD process, a PECVD process, an ALD process, or combinations thereof.

It can be understood that the abovementioned word line structure is a buried word line structure, which may include a dielectric material layer, a metal layer, a polysilicon layer, and an isolating layer formed in a groove.

The description above is only the preferred embodiments of the disclosure and is not intended to limit the scope of protection of the disclosure. Any modifications, equivalent replacements, improvements, etc. made within the spirit and principle of the disclosure shall fall within the scope of protection of the disclosure.

INDUSTRIAL APPLICABILITY

In the embodiments of the disclosure, during cleaning, the semiconductor structure is rotated, and at least one metal surface planarization process is performed on the semiconductor structure, so that the edge position of the top surface of the metal layer is impacted by the first reagent under the action of a centrifugal force. As such, the residual metal at the edge position of the top surface of the metal layer of the semiconductor structure is removed, and the top surface of the metal layer after being processed is more planar than the top surface of the metal layer before being processed.

The invention claimed is:

1. A method for forming a word line structure, comprising:
providing a substrate;
forming a groove in the substrate, and forming a dielectric material layer on a bottom surface and a side wall of the groove and on a surface of the substrate;
forming a pre-metal layer on the dielectric material layer;
etching the pre-metal layer to form a metal layer located in the groove, wherein an edge position of a top surface of the metal layer is higher than a center position of the top surface of the metal layer, the top surface of the metal layer is lower than an opening of the groove, and the metal layer comprises a void therein;
processing the metal layer, so that the top surface of the metal layer after being processed is more planar than the top surface of the metal layer before being processed and is higher than the void, wherein a method of processing the metal layer comprises:
enabling the substrate to be in a rotating state; and
performing at least one metal surface planarization process on the metal layer,
wherein each of the at least one metal surface planarization process comprises:
etching the top surface of the metal layer by a first reagent; and
cleaning the semiconductor structure by a second reagent;
forming on the metal layer a polysilicon layer located in the groove, wherein the void is free of a material of the polysilicon layer; and
forming an isolating layer on the polysilicon layer.

2. The method of claim 1, wherein
the first reagent comprises an acid reagent, and the second reagent comprises at least one of an alkaline reagent or a neutral reagent.

3. The method of claim 2, wherein
the first reagent comprises at least one of a mixed solution of deionized water, HCl and $H_2O_2$ (SC2 solution), a mixed solution of sulfuric acid and hydrogen peroxide solution, or a mixed solution of hydrochloric acid and hydrogen peroxide solution.

4. The method of claim 2, wherein
the second reagent comprises at least one of a mixed solution of deionized water, $NH_4OH$, and $H_2O_2$ (SC1 solution), deionized aqueous solution, aqueous ammonia, or hydrogen peroxide.

5. The method of claim 3, wherein
a volume ratio of sulfuric acid to hydrogen peroxide solution in the mixed solution of sulfuric acid and hydrogen peroxide solution ranges from 5:1 to 8:1.

6. The method of claim 1, wherein
the at least one metal surface planarization process comprises 4 to 8 metal surface planarization processes.

7. The method of claim 1, wherein
the time for etching the top surface of the metal layer by the first reagent for one time ranges from 8 s to 50 s.

8. The method of claim 1, wherein
the time for cleaning the semiconductor structure by the second reagent for one time ranges from 25 s to 35 s.

9. The method of claim 1, wherein
the at least one metal surface planarization process comprises a plurality of metal surface planarization processes; and a sum of the time for etching the top surface of the metal layer in the plurality of metal surface planarization processes ranges from 45 s to 90 s.

10. The method of claim 1, wherein the material of the metal layer comprises at least one of titanium nitride (TiN), molybdenum, or tungsten.

11. The method of claim 1, wherein
a rotating speed of the semiconductor structure ranges from 500 rpm to 800 rpm.

12. The method of claim 1, wherein
in a process of etching the top surface of the metal layer by the first reagent, the semiconductor structure rotates at a first rotating speed;
in a process of cleaning the semiconductor structure by the second reagent, the semiconductor structure rotates at a second rotating speed; and
wherein the first rotating speed is less than the second rotating speed.

13. The method of claim 1, wherein
in a process of etching the top surface of the metal layer by the first reagent, the semiconductor structure rotates at a first rotating speed;
in a process of cleaning the semiconductor structure by the second reagent, the semiconductor structure rotates at a second rotating speed; and
wherein the first rotating speed is equal to the second rotating speed.

14. The method of claim 1, wherein
the metal layer comprises a void therein; and
after performing the at least one metal surface planarization process, the top surface of the metal layer is located above the void.

* * * * *